(12) United States Patent
Bellancourt et al.

(10) Patent No.: US 9,916,918 B2
(45) Date of Patent: Mar. 13, 2018

(54) CONNECTION BAR ARCHITECTURE FOR HIGH-POWER CONVERTER

(71) Applicant: Alstom Technology Ltd, Baden (CH)

(72) Inventors: Raphaël Bellancourt, Igny (FR); Philippe Josse, Paris (FR); Joël Devautour, Le Percq (FR)

(73) Assignee: General Electric Technology GmbH, Baden (CH)

( * ) Notice: Subject to any disclaimer, the term of this patent is extended or adjusted under 35 U.S.C. 154(b) by 259 days.

(21) Appl. No.: 14/770,643

(22) PCT Filed: Feb. 25, 2014

(86) PCT No.: PCT/EP2014/053574
§ 371 (c)(1),
(2) Date: Aug. 26, 2015

(87) PCT Pub. No.: WO2014/131740
PCT Pub. Date: Sep. 4, 2014

(65) Prior Publication Data
US 2016/0012938 A1    Jan. 14, 2016

(30) Foreign Application Priority Data
Feb. 28, 2013 (FR) .................................. 13 51817

(51) Int. Cl.
*H01B 7/42* (2006.01)
*H01B 5/02* (2006.01)
*H02G 5/10* (2006.01)
*C25C 7/00* (2006.01)
(Continued)

(52) U.S. Cl.
CPC ................. *H01B 5/02* (2013.01); *C25B 9/04* (2013.01); *C25C 7/00* (2013.01); *H02G 5/10* (2013.01); *H05K 7/20927* (2013.01)

(58) Field of Classification Search
CPC ........... H02M 7/003; H02B 1/20; H02B 1/21; H02G 5/00; H02G 5/10; H01B 5/02; H05K 7/20927; C25B 9/04; C25C 7/00
See application file for complete search history.

(56) References Cited

U.S. PATENT DOCUMENTS 3,354,261 A    11/1967    Polgov
5,517,063 A *  5/1996    Schantz, Jr. ............ B60L 3/00
                                                    307/9.1
(Continued)

FOREIGN PATENT DOCUMENTS

WO    20121062707 A2    5/2012
WO    20121114176 A1    8/2012

OTHER PUBLICATIONS

Search Report issued in French Patent Application No. FR 13 51817 dated Nov. 15, 2013.
(Continued)

*Primary Examiner* — James Wu
(74) *Attorney, Agent, or Firm* — GE Global Patent Operation; Scott R. Stanley

(57) ABSTRACT

The invention mainly provides a busbar (BS1) designed to provide an electrical connection between a high-power converter (R) and a disconnector (S), said busbar being characterized in that the busbar (BS1) has a shape defining, at least in part, at least one hollow portion (10).

5 Claims, 3 Drawing Sheets

(51) Int. Cl.
*C25B 9/04* (2006.01)
*H05K 7/20* (2006.01)

(56) References Cited

U.S. PATENT DOCUMENTS

| | | | | |
|---|---|---|---|---|
| 6,574,094 B1* | 6/2003 | Morrow | ............... | F28D 5/00 |
| | | | | 165/104.33 |
| 6,822,865 B2* | 11/2004 | Balszunat | ............ | H01L 23/473 |
| | | | | 165/80.4 |
| 2012/0218684 A1* | 8/2012 | Andersen | ............... | H02B 1/20 |
| | | | | 361/601 |
| 2013/0301320 A1 | 11/2013 | Mariadassou | | |
| 2014/0362627 A1* | 12/2014 | Sun | ................ | H02M 7/003 |
| | | | | 363/132 |

OTHER PUBLICATIONS

International Search Report issued in Application No. PCT/EP2014/053574 dated May 20, 2014.
Written Opinion issued in Application No. PCT/EP2014/053574 dated May 20, 2014.
U.S. Appl. No. 14/770,947, "Power Converter Comprising an Architecture Having Nonaligned Arms" filed Aug. 27, 2015.

* cited by examiner

CONNECTION BAR ARCHITECTURE FOR HIGH-POWER CONVERTER

TECHNICAL FIELD

The present invention relates to the field of high-power converters in electrolysis. By way of example, such converters can serve to produce aluminum, zinc, copper, or chlorine by an electrolytic reduction process.

The invention relates more particularly to a busbar designed to provide an electrical connection between a high-power converter and a disconnector, and the invention also relates more particularly to a converter circuit including such a busbar.

STATE OF THE PRIOR ART

In the field of power electronics, high-power semiconductor converters for electrolysis are typically rectifiers that convert an alternating current (AC) source directly into a direct current (DC) source. Such rectifiers can be rectifiers using diode technology, also referred to as "non-controlled rectifiers", or else they can be rectifiers using thyristor technology, also referred to as "controlled rectifiers".

FIG. 1 shows a simplified electric circuit diagram of a rectifier circuit 1 that can be found conventionally in an installation of an electrolysis plant for the purpose of powering electrolysis pots. Such a rectifier circuit can, for example, be used to power something other than electrolysis pots, e.g. electric arc furnaces or plasma generators that also require high power.

The rectifier circuit 1 includes a power converter in the form of a rectifier R, powered by AC input current by two three-phase transformers TR1 and TR2. At its output, the rectifier R delivers DC to the series of pots or "potline" P via a disconnector S placed between the rectifier R and the potline P. A fluid, in particular water, flows through the rectifier R in order to cool it (this fluid is represented by the arrows F in FIG. 1).

The current is transmitted between the rectifier R and the disconnector S by means of the presence of busbars located between the rectifier R and the disconnector S. In particular, these busbars comprise two busbars referred to as the "DC+ output busbar" BS1 and as the "DC− output busbar" BS2.

FIG. 2 is a diagrammatic perspective view showing a power converter in the form of a rectifier R equipped with a prior art DC output busbar BS1. The DC output bar BS2 is not shown but its shape is analogous to the shape of the DC busbar BS1. As can be seen in FIG. 2, the DC busbar BS1 is of a solid shape, and is, in particular, in the general shape of a solid rectangular block, extending from the rectifier R. This type of DC busbar BS1 is generally dimensioned with a current density of 0.5 amps per square millimeter (A/mm$^2$), which, for a high-power converter, results in having a very large connection cross-sectional area s. For example, for a converter of a DC current of 105 kiloamps (kA), the cross-sectional area s has a length L of 140 centimeters (cm) for a width l of 15 cm. In addition, the cooling fluid flows only through the rectifier R, as indicated by the arrow F in FIG. 2.

International application WO 2012/114176 A1, patents U.S. Pat. No. 3,354,261 A and U.S. Pat. No. 6,574,094 B1, and international application WO 2012/062707 A2 describe also other embodiments according to prior art.

The design of prior art busbars gives rise to various constraints and drawbacks. The present trend in high-power converters is for the power of said converters to be increased, resulting in an increase in the size of the busbars and to an increase in their heat dissipation capacities. Unfortunately, prior art busbars are too large in size. In addition, prior art busbars do not make it possible to cool the disconnector. It is necessary to use a separate circuit, making the overall hydraulic circuit more complicated.

SUMMARY OF THE INVENTION

An object of the invention is to remedy, at least in part, the above-mentioned needs and drawbacks, relating to the prior art.

In one of its aspects, the invention therefore provides a busbar designed to provide an electrical connection between a high-power converter and a disconnector, belonging, in particular, to an installation of an electrolysis plant, said busbar being characterized in that the busbar has a shape defining, at least in part, at least one hollow portion.

The busbar may be designed to pass a cooling fluid making it possible to cool the busbar.

The term "busbar" means any type of electrical connection structure between a power converter and the disconnector, the shape of which may be other than bar-shaped. In particular, the busbar is a DC+ or DC− output busbar.

By means of the invention, it is possible to optimize and to increase the power of high-power converters by means of the busbars having a specific architecture, with a shape defining a hollow portion that makes it possible to reduce the dimensions and to optimize the flow of the cooling fluid. In addition, the invention may make it possible to obtain a significant saving in terms of busbar weight due to their shapes defining hollow portions. For example, the weight of aluminum is reduced by three-quarters, thereby facilitating transport and handling. The total weight of the installation in operation, including, in particular, the aluminum and the cooling fluid, is also reduced by half. In addition, the same cooling circuit can be used to cool the disconnector and the power converter. The busbar shape forming a hollow portion can enable the cooling fluid to pass through the busbars. Finally, the invention can make it possible to procure a large saving in terms of manufacturing and maintenance costs.

The busbar of the invention may also have one or more of the following characteristics taken in isolation or in any technically feasible combination.

Said at least one hollow portion defined at least in part by the busbar may be likened to an empty space or cavity formed at least in part by the busbar.

Forming such a hollow portion by the busbar can make it possible to optimize the architecture of the busbar and to increase the power of the high-power converter.

In particular, prior art busbars are usually made of solid aluminum and their weight tends to unbalance the converter as a whole. The busbar of the invention having a shape that defines a hollow portion at least in part makes it possible to lighten the weight of the busbar and to increase the effectiveness of the converter.

The busbar may be configured to enable a cooling fluid to pass through the inside of it. The busbar can thus be cooled by such a fluid.

The busbar may be arranged so that its shape defines said at least one hollow portion at least in part, and so that the other fraction of said at least one hollow portion is defined by the high-power converter. In particular, said at least one hollow portion may be formed and defined entirely once the busbar is assembled to the high-power converter.

The busbar may comprise three bars (or sub-bars) designed to come into contact with the high-power converter. The two bars may be connected to a common web designed to come into contact with the disconnector.

The two bars may be mutually parallel. The two bars may be perpendicular to the web.

The web may be likened to a bar, the busbar then comprising three bars (or sub-bars).

The busbar may be U-shaped. In particular, the two bars and the web (or third bar) may form a U-shape. This U-shape may define, in part, a hollow portion or any other possible shape. The other fraction of the hollow portion may be defined by the portion of the converter that is situated between the two bars once the busbar is assembled to the high-power converter.

In particular, the busbar may be a DC+ or DC− output busbar.

The busbar may be removable, in particular when it can be fastened by screws to the high-power converter.

In another of its aspects, the invention provides a converter circuit, in particular for an installation of an electrolysis plant, the circuit including a high-power converter and a disconnector that are interconnected electrically;

said converter circuit being characterized in that it also includes a busbar as defined above for the purpose of electrically connecting the high-power converter to the disconnector.

The high-power converter may, in particular, be a rectifier.

The same cooling fluid may flow through the converter, through the busbar, and through the disconnector. In particular, the same, common cooling circuit may be used to cool the converter and the disconnector.

The two bars may be fastened to the high-power converter by welding.

The converter circuit may include at least one mounting element fastened to the high-power converter. At least one of the two bars may be fastened by screws to said at least one mounting element, in particular by means of a system of flanges.

In particular, the converter circuit may include two mounting elements, e.g. welded to the high-power converter, and the busbar may be U-shaped having two bars fastened by screws to the two mounting elements.

Such a configuration may make it possible to optimize assembly of the converter circuit, and in particular assembly of the busbar. The busbar can thus be removable.

Whereas prior art busbars are assembled by welding to high-power converters, the busbar of the invention may, for example, be assembled by screws, in particular by means of flanges, which can make it possible to procure a gain in compactness and easier access for maintenance.

The converter circuit of the invention may have any of the above-listed characteristics taken in isolation or in any technically feasible combination with other characteristics.

BRIEF DESCRIPTION OF THE DRAWINGS

The invention can be better understood on reading the following detailed description of non-limiting embodiments of the invention, and on examining the diagrammatic and fragmentary figures of the accompanying drawings, in which.

In all of these figures, identical references may designate elements that are identical or elements that are analogous.

DETAILED DESCRIPTION OF PARTICULAR EMBODIMENTS

Figure 1:
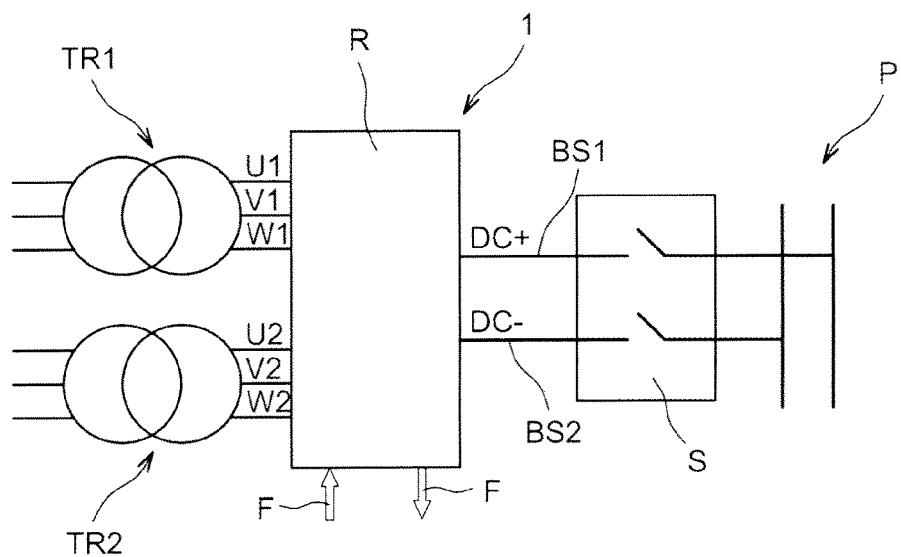
FIG. 1 is an example of a simplified electric circuit diagram of a prior art high-power converter in the field of electrolysis.
Figure 2:
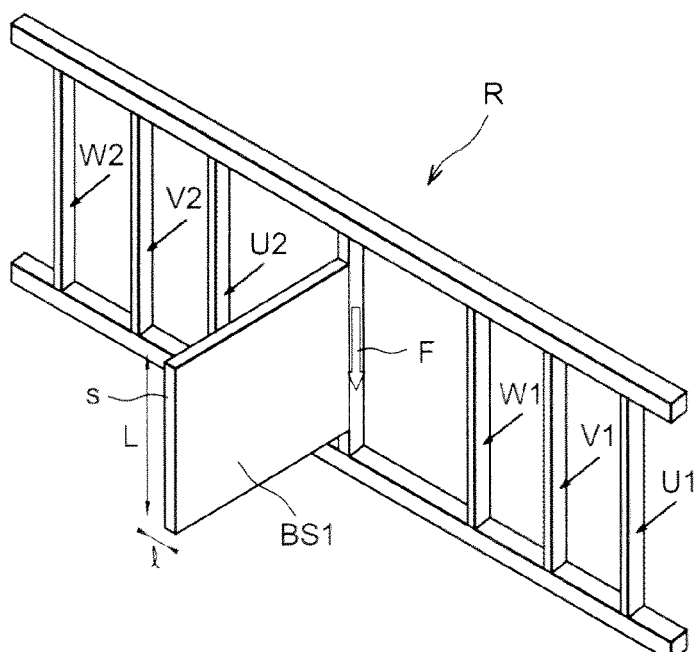
FIG. 2 is a diagrammatic perspective view of a power converter equipped with a prior art busbar.
Figure 3:
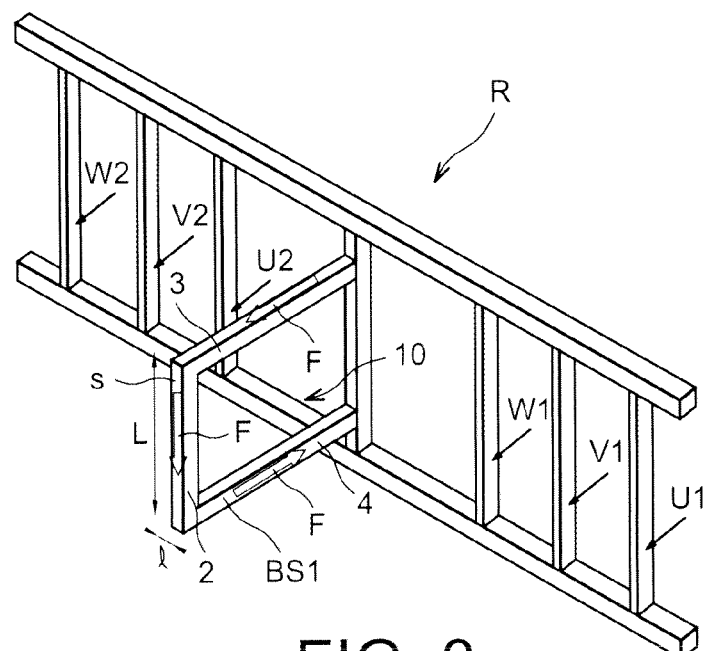
FIG. 3 is a diagrammatic perspective view of a power converter equipped with a busbar of the invention.

FIG. 3 shows an example of a high-power converter in the form of a rectifier R including a busbar BS1 of the invention.

The rectifier R is designed to be powered with AC via two three-phase transformers (not shown), and to deliver DC to a potline P of an electrolysis plant via a disconnector S and two busbars in the form of a DC+ output busbar and a DC− output busbar, as explained above.

In the figures, only the DC+ output busbar BS1 is shown, but the DC− output busbar may naturally be designed in analogous manner.

In accordance with the invention, the connection busbar BS1 has a shape defining a hollow portion 10.

More precisely, the busbar BS1 comprises two mutually parallel bars 3 and 4 connected to a common web 2. The two bars 3 and 4 are fastened to the rectifier R and the web 2 is fastened to the disconnector S.

Advantageously, by forming the hollow portion 10 by arranging the busbar BS1 on the rectifier R, it is possible for the cooling fluid coming from the rectifier R to flow inside the busbar BS1 (the fluid being represented by the arrows F in the figures), in such a manner as to enable the fluid also to flow through the busbar of the disconnector S.

The connection cross-sectional area s of the busbar BS1 may be small. In particular, the length L and the width l of the cross-sectional area s may be of dimensions smaller than or indeed equivalent to the dimensions of a prior art busbar.

Figure 4:
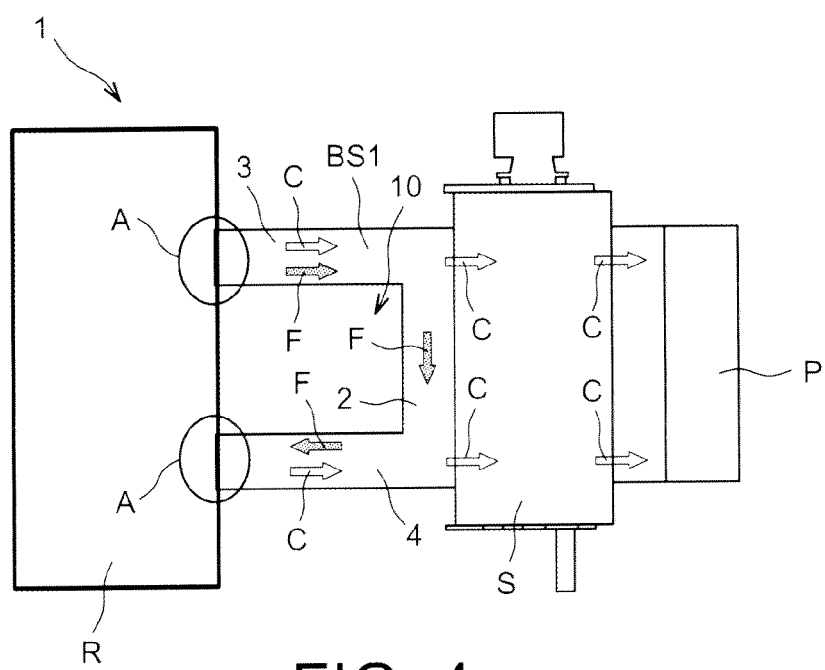
FIG. 4 shows an example of a portion of a rectifier circuit including a busbar of the invention.
Figure 5:
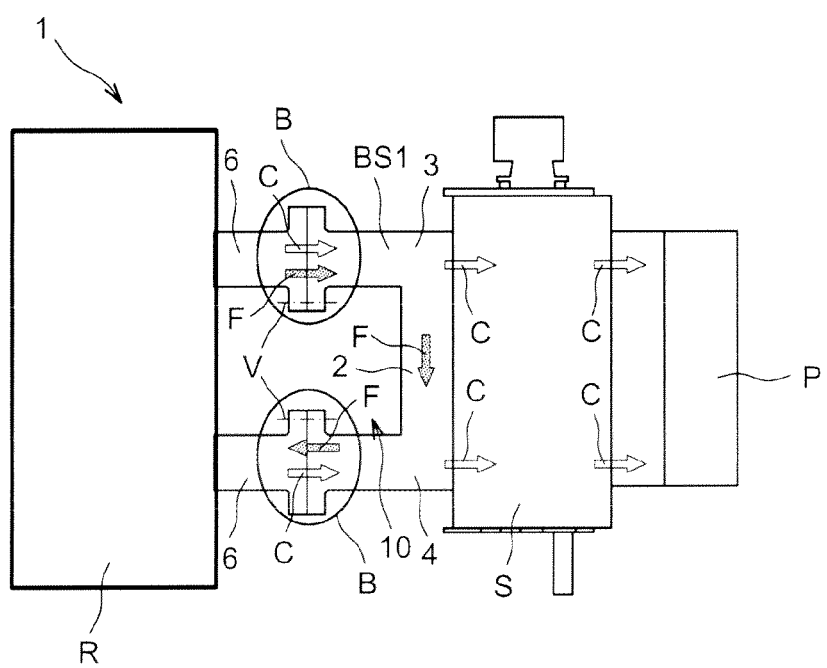
FIG. 5 shows a variant embodiment of the example of FIG. 4, with connection via flanges.

FIGS. 4 and 5 show two embodiments of a rectifier circuit 1 of the invention.

The rectifier circuit 1 includes a rectifier R powering a potline P with DC via a disconnector S and via a busbar BS1 of the invention.

The electric current flows from the rectifier R through the busbar BS1 and through the disconnector S (said electrical current is represented by the arrows C in the figures), and the cooling fluid flows from the rectifier R into the busbar BS1 so as to cool the busbar of the disconnector S (said fluid is represented by the arrows F).

In the example of FIG. 4, the busbar BS1 comprises two bars 3 and 4 that are fastened to the rectifier 4 by welding at the contact zones A.

In the example shown in FIG. 5, the converter circuit 1 includes two mounting elements 6 that are fastened to the rectifier R. Both of the mounting elements 6 and both of the bars 3 and 4 of the busbar BS1 are provided with flanges forming a system of flanges B for enabling the bars 3 and 4 to be fastened to the mounting elements 6 by screws V.

Such an assembly using screws to assemble the busbar BS1 to the mounting elements 6 secured to the or integral with the rectifier R enables the busbar to be made removable and enables the maintenance operations to be facilitated.

Naturally, the invention is not limited to the above-described embodiments. Various modifications may be made by the person skilled in the art.

What is claimed is:

1. A circuit comprising:
   a high-power converter;
   a disconnector; and
   a busbar providing an electrical connection between the high-power converter and the disconnector, the busbar having a shape defining a hollow portion that enables a cooling fluid to pass from the high-power converter to the disconnector through the busbar, the busbar comprising:
      at least two bars in contact with the high-power converter; and
      a web coupled to the at least two bars and in contact with the disconnector.

2. The circuit of claim 1, wherein the high-power converter includes a hollow portion to allow the cooling fluid to pass from the high-power converter, the hollow portion of the high-power converter being coupled to the hollow portion of the busbar.

3. The circuit of claim 1, wherein the busbar is U-shaped.

4. The circuit of claim 1, wherein the at least two bars are in contact with the high-power converter by welding.

5. The circuit of claim 1, further comprising at least one mounting element coupled to the high-power converter, the at least one mounting element being coupled to at least one of the at least two bars by a system of flanges.

\* \* \* \* \*